United States Patent
Wu et al.

(10) Patent No.: US 9,304,851 B2
(45) Date of Patent: Apr. 5, 2016

(54) DECODING WITH LOG LIKELIHOOD RATIOS STORED IN A CONTROLLER

(71) Applicant: Seagate Technology LLC, Cupertino, CA (US)

(72) Inventors: Yunxiang Wu, Cupertino, CA (US); Zhengang Chen, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 179 days.

(21) Appl. No.: 14/136,380

(22) Filed: Dec. 20, 2013

(65) Prior Publication Data
US 2015/0149856 A1    May 28, 2015

Related U.S. Application Data (60) Provisional application No. 61/909,529, filed on Nov. 27, 2013.

(51) Int. Cl.
*H03M 13/00*    (2006.01)
*G06F 11/10*    (2006.01)
*G11C 11/56*    (2006.01)

(52) U.S. Cl.
CPC ............ *G06F 11/10* (2013.01); *G06F 11/1068* (2013.01); *G11C 11/5642* (2013.01)

(58) Field of Classification Search
CPC ....................................................... G06F 11/10
See application file for complete search history.

(56) References Cited

U.S. PATENT DOCUMENTS

| | | | |
|---|---|---|---|
| 7,797,480 B2 | 9/2010 | Mokhlesi et al. | 711/103 |
| 8,307,267 B2 | 11/2012 | Venkataramani et al. | 714/795 |
| 8,374,026 B2 | 2/2013 | Sharon et al. | 365/185.02 |
| 8,498,152 B2 | 7/2013 | Alrod et al. | 365/185.03 |
| 2011/0252289 A1 | 10/2011 | Patapoutian et al. | 714/763 |
| 2012/0014480 A1* | 1/2012 | Gotman et al. | 375/340 |
| 2013/0094286 A1 | 4/2013 | Sridharan et al. | 365/185.2 |
| 2014/0040704 A1* | 2/2014 | Wu et al. | 714/773 |
| 2014/0164868 A1* | 6/2014 | Haratsch et al. | 714/763 |

* cited by examiner

*Primary Examiner* — Sam Rizk
(74) *Attorney, Agent, or Firm* — Christopher P. Maiorana, PC (57) ABSTRACT

An apparatus having one or more lookup tables and a decoder is disclosed. The lookup tables are configured to store a plurality of sets of values of log likelihood ratios. The decoder is configured to (i) receive a codeword read from a memory, (ii) receive an initial one of the sets from the lookup tables and (iii) generate read data by decoding the codeword based on the values.

20 Claims, 8 Drawing Sheets

TABLE 1

| ONE READ (HARD DECISION READ) | | | | |
|---|---|---|---|---|
| | LSB PAGE | | MSB PAGE | |
| LLR\HARD DECISION | 1 | 0 | 1 | 0 |
| NLLR | 5 | -4 | 4 | -5 |
| CLLR1 | 3 | -5 | 3 | -3 |
| CLLR2 | 2 | -6 | 2 | -3 |

TABLE 2

| TWO READS | | | | | | | |
|---|---|---|---|---|---|---|---|
| | LSB LLR | | | MSB LLR | | | |
| LLR\HARD DECISION | 11 | 01 | 00 | 11 | 01 | 00 | 10 |
| NLLR | 6 | 0 | -5 | 6 | 1 | -4 | 0 |
| CLLR1 | 7 | 1 | -5 | 9 | 2 | -4 | -1 |
| CLLR2 | 10 | 3 | -4 | 12 | 4 | -5 | -4 |

TABLE 3

| THREE READS | | | | | | | | | |
|---|---|---|---|---|---|---|---|---|---|
| | LSB LLR | | | | MSB LLR | | | | |
| LLR\HARD DECISION | 111 | 011 | 001 | 000 | 111 | 011 | 001 | 000 | 100 | 110 |
| NLLR | 6 | 0 | -5 | -5 | 6 | 1 | -4 | 0 | -5 | 2 |
| CLLR1 | 7 | 1 | -5 | -5 | 9 | 2 | -4 | -1 | -5 | 0 |
| CLLR2 | 10 | 3 | -4 | -4 | 12 | 4 | -5 | -4 | -4 | -3 |

TABLE 4

| FOUR READS | | | | | | | | | | | | |
|---|---|---|---|---|---|---|---|---|---|---|---|---|
| | LSB LLR | | | | | MSB LLR | | | | | | |
| LLR\HARD DECISION | 1111 | 0111 | 0011 | 0001 | 0000 | 1111 | 0111 | 0011 | 0001 | 0000 | 1000 | 1100 | 1110 |
| NLLR | 6 | 2 | 0 | -2 | -5 | 6 | 3 | 1 | 0 | -4 | -2 | 0 | 2 |
| CLLR1 | 7 | 3 | 2 | 0 | -5 | 9 | 5 | 3 | 1 | -4 | -3 | -2 | 0 |
| CLLR2 | 10 | 6 | 4 | 2 | -4 | 12 | 7 | 4 | 2 | -5 | -7 | -5 | -3 |

TABLE 1

ONE READ (HARD DECISION READ)

| LLR\HARD DECISION | LSB PAGE | MSB PAGE |
|---|---|---|
|  | 1 | 0 | 1 | 0 |
| NLLR | 5 | -4 | 4 | -5 |
| CLLR1 | 3 | -5 | 3 | -3 |
| CLLR2 | 2 | -6 | 2 | -3 |

210, 212, 214 — 216

TABLE 2

TWO READS

| LLR\HARD DECISION | LSB LLR | | | | MSB LLR | | | |
|---|---|---|---|---|---|---|---|---|
|  | 11 | 01 | 00 | 11 | 00 | 01 | 11 | 10 |
| NLLR | 6 | 0 | -5 | 6 | -4 | 1 | 6 | 0 |
| CLLR1 | 7 | 1 | -5 | 9 | -4 | 2 | 9 | -1 |
| CLLR2 | 10 | 3 | -4 | 12 | -5 | 4 | 12 | -4 |

218

TABLE 3

THREE READS

| LLR\HARD DECISION | LSB LLR | | | | MSB LLR | | | |
|---|---|---|---|---|---|---|---|---|
|  | 111 | 011 | 001 | 000 | 111 | 011 | 001 | 000 | 110 | 100 |
| NLLR | 6 | 0 | -5 | -5 | 6 | 1 | -4 | 0 | 2 | -5 |
| CLLR1 | 7 | 1 | -5 | -5 | 9 | 2 | -4 | -1 | 0 | -5 |
| CLLR2 | 10 | 3 | -4 | -4 | 12 | 4 | -5 | -4 | -3 | -4 |

220

TABLE 4

FOUR READS

| LLR\HARD DECISION | LSB LLR | | | | | MSB LLR | | | | | |
|---|---|---|---|---|---|---|---|---|---|---|---|
|  | 1111 | 0111 | 0011 | 0001 | 0000 | 1111 | 0111 | 0011 | 0001 | 0000 | 1100 | 1110 |
| NLLR | 6 | 2 | 0 | -2 | -5 | 6 | 3 | 1 | 0 | -4 | 0 | 2 |
| CLLR1 | 7 | 3 | 2 | 0 | -5 | 9 | 5 | 3 | 1 | -4 | -2 | 0 |
| CLLR2 | 10 | 6 | 4 | 2 | -4 | 12 | 7 | 4 | 2 | -5 | -5 | -3 |

TABLE 5

FIVE READS

| LLR\HARD DECISION | LSB LLR | | | | | | | MSB LLR | | | | | |
|---|---|---|---|---|---|---|---|---|---|---|---|---|---|
| | 11111 | 01111 | 00111 | 00011 | 00001 | 00000 | | 11111 | 01111 | 00111 | 00011 | 00001 | 00000 |
| NLLR | 6 | 2 | 0 | -2 | -5 | 2 | 6 | 3 | 1 | 0 | -4 | -2 | 0 | -2 | 2 |
| CLLR1 | 7 | 3 | 2 | 0 | -5 | 0 | 9 | 5 | 3 | 1 | -4 | -3 | -2 | -3 | 0 |
| CLLR2 | 10 | 6 | 4 | 2 | -4 | -3 | 12 | 7 | 4 | 2 | -5 | -7 | -5 | -3 | -3 |

TABLE 6

SIX READS LSB

| LLR\HARD DECISION | LSB LLR | | | | | | |
|---|---|---|---|---|---|---|---|
| | 111111 | 011111 | 001111 | 000111 | 000011 | 000001 | 000000 |
| NLLR | 7 | 3 | 2 | 0 | -2 | -3 | -7 |
| CLLR1 | 9 | 5 | 3 | 2 | 0 | -2 | -7 |
| CLLR2 | 12 | 8 | 6 | 4 | 2 | 0 | -6 |
| CLLR3 | 7 | 3 | 2 | 0 | -2 | -3 | -7 |
| CLLR4 | 9 | 5 | 3 | 2 | 0 | -2 | -7 |
| CLLR5 | 12 | 8 | 6 | 4 | 2 | 0 | -6 |

...

SIX READS MSB

| LLR\HARD DECISION | MSB LLR | | | | | | |
|---|---|---|---|---|---|---|---|
| | 111111 | 011111 | 001111 | 000111 | 000011 | 000001 | 000000 | 100000 | 110000 | 111000 | 111100 | 111110 |
| NLLR | 8 | 4 | 3 | 1 | 0 | -2 | -5 | -5 | -4 | -2 | 0 | 2 | 4 |
| CLLR1 | 11 | 7 | 5 | 3 | 1 | -1 | -5 | -5 | -5 | -3 | -2 | 0 | 2 |
| CLLR2 | 14 | 10 | 7 | 4 | 2 | 0 | -5 | -5 | -8 | -7 | -5 | -3 | -1 |
| CLLR3 | 8 | 4 | 3 | 1 | 0 | -2 | -5 | -5 | -4 | -2 | 0 | 2 | 4 |
| CLLR4 | 11 | 7 | 5 | 3 | 1 | -1 | -5 | -5 | -5 | -3 | -2 | 0 | 2 |
| CLLR5 | 14 | 10 | 7 | 4 | 2 | 0 | -5 | -5 | -8 | -7 | -5 | -3 | -1 |

FIG. 10

TABLE 7

SEVEN READS LSB

LSB LLR

| LLR \ HARD DECISION | 11111110 | 01111111 | 00111111 | 00011111 | 00001111 | 00000111 | 00000011 | 00000001 | 00000000 |
|---|---|---|---|---|---|---|---|---|---|
| NLLR | 7 | 3 | 2 | 0 | -2 | -3 | -7 | -7 | -7 |
| CLLR1 | 9 | 5 | 3 | 2 | 0 | -2 | -7 | -7 | -7 |
| CLLR2 | 12 | 8 | 6 | 4 | 2 | 0 | -6 | -6 | -6 |
| CLLR3 | 7 | 3 | 2 | 0 | -2 | -3 | -7 | -7 | -7 |
| CLLR4 | 9 | 5 | 3 | 2 | 0 | -2 | -7 | -7 | -7 |
| CLLR5 | 12 | 8 | 6 | 4 | 2 | 0 | -6 | -6 | -6 |
| CLLR6 | 12 | 8 | 6 | 4 | 2 | 0 | -6 | -6 | -6 |

...

SEVEN READS MSB

MSB LLR

| LLR \ HARD DECISION | 11111110 | 01111111 | 00111111 | 00011111 | 00001111 | 00000111 | 10000000 | 11000000 | 11100000 | 11110000 | 11111000 | 11111100 | 11111110 |
|---|---|---|---|---|---|---|---|---|---|---|---|---|---|
| NLLR | 8 | 4 | 3 | 1 | 0 | -2 | -4 | -5 | -2 | 0 | 2 | 4 | -7 |
| CLLR1 | 11 | 7 | 5 | 3 | 1 | -1 | -5 | -5 | -3 | -2 | 0 | 2 | -7 |
| CLLR2 | 14 | 10 | 7 | 4 | 2 | 0 | -8 | -5 | -7 | -5 | -3 | -1 | -6 |
| CLLR3 | 8 | 4 | 3 | 1 | 0 | -2 | -4 | -5 | -2 | 0 | 2 | 4 | -7 |
| CLLR4 | 11 | 7 | 5 | 3 | 1 | -1 | -5 | -5 | -3 | -2 | 0 | 2 | -7 |
| CLLR5 | 14 | 10 | 7 | 4 | 2 | 0 | -8 | -5 | -7 | -5 | -3 | -1 | -6 |
| CLLR6 | 14 | 10 | 7 | 4 | 2 | 0 | -8 | -5 | -7 | -5 | -3 | -1 | -6 |

FIG. 11

DECODING WITH LOG LIKELIHOOD RATIOS STORED IN A CONTROLLER

This application relates to U.S. Provisional Application No. 61/909,529, filed Nov. 27, 2013, which is hereby incorporated by reference in its entirety.

FIELD OF THE INVENTION

The invention relates to soft decoding generally and, more particularly, to a method and/or apparatus for implementing decoding with log likelihood ratios stored in a controller.

BACKGROUND

Raw bit error rates of NAND flash memory are becoming poorer due to aggressive process scaling. To maintain the same level of reliability, conventional solid-state drive controllers are adopting error correction codes with soft decoding capability, such as low density parity check codes. The low density parity check codes provide good error correction by using soft inputs to aid in decoding decisions. The soft inputs are normally in the form of log likelihood ratio values. Since conventional flash devices do not provide soft decision values, the solid-state drive controllers have no natural values to utilize.

SUMMARY

The invention concerns an apparatus having one or more lookup tables and a decoder. The lookup tables are configured to store a plurality of sets of values of log likelihood ratios. The decoder is configured to (i) receive a codeword read from a memory, (ii) receive an initial one of the sets from the lookup tables and (iii) generate read data by decoding the codeword based on the values.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing decoding with log likelihood ratio values stored in a controller that may (i) operate independently of flash cell voltage distributions, (ii) decode with different log likelihood ratio values for different number of retry reads, (iii) operate independently of channel distribution properties, (iv) have low complexity, (v) be suitable for firmware implementation and/or (vi) be implemented as one or more integrated circuits.

Embodiments of the invention provide one or more lookup tables (e.g., LUTS) in a solid-state drive (e.g., SSD) controller. The lookup tables are generally populated with decoding parameters (e.g., log likelihood ratio (e.g., LLR) values) suitable for use in a soft-decoder. The parameters in the lookup tables are predetermined in simulations or test scenarios. Each value corresponds to a number of reads and/or retry reads, patterns resulting from the reads and/or retry reads, a number of previously failed decoding attempts and the page that is being accessed.

Although cell voltages in flash devices are continuous, flash devices only provide binary sequences (e.g., hard decisions) after each read operation. When soft decoding techniques are used for error correction, the hard decisions are converted into the decoding parameters fed into the decoder operation. The decoding parameters are associated with a single read or multiple reads. The multiple reads are performed with varying read voltages to obtain more information from the flash devices, which results in better quality of the decoding parameters.

Figure 1:
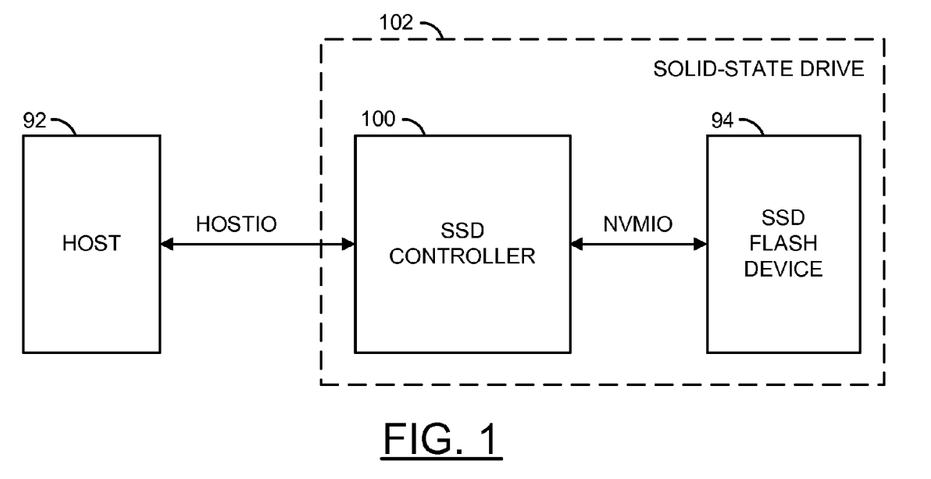
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 94 and 100 form a drive (or device) 102. The circuits 92 to 102 may represent modules and/or blocks that may be implemented as hardware, software, a combination of hardware and software, or other implementations.

One or more signals (e.g., HOSTIO) are exchanged between the circuit 92 and the circuit 100. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92. One or more signals (e.g., NVMIO) are exchanged between the circuit 100 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 100 into the circuit 94 and a read codeword component that carries the error correction coded codewords read from the circuit 94 to the circuit 100.

The circuit 92 is shown implemented as a host circuit. The circuit 92 is generally operational to read and write data to and from the circuit 94 via the circuit 100. When reading or writing, the circuit 92 transfers a logical address value in the signal HOSTIO to identify which set of data is to be written or to be read from the circuit 94. The address generally spans a logical address range of the circuit 102. The logical address can address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

In some embodiments, the circuit 94 may be implemented as a single-level cell (e.g., SLC) type circuit. A single-level cell type circuit generally stores a single bit per memory cell (e.g., a logical 0 or 1). In other embodiments, the circuit 94 may be implemented as a multi-level cell type circuit. A multi-level cell type circuit is capable of storing multiple (e.g., two) bits per memory cell (e.g., logical 00, 01, 10 or 11). In still other embodiments, the circuit 94 may implement a triple-level cell type circuit. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

Data within the circuit 94 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page includes an integer number of codewords.

The circuit 100 is shown implementing a controller circuit. The circuit 100 is generally operational to control reading to and writing from the circuit 94. The circuit 100 includes an ability to decode the read codewords received from the circuit 94. The resulting decoded data is presented to the circuit 92 via the signal HOSTIO and/or re-encoded and written back into the circuit 94 via the signal NVMIO. The circuit 100 comprises one or more integrated circuits (or chips or die) implementing the controller of one or more solid-state drives, embedded storage, or other suitable control applications.

As part of the decoding, the circuit 100 looks up decoding parameters (e.g., the log likelihood ratio values) stored in one or more internal tables. The decoding parameters are used as part of an iterative decoding procedure that attempts to correct any errors that may be present in the codewords. The decoding parameters generally inform the decoding procedure of a reliability for each respective bit of the codewords.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
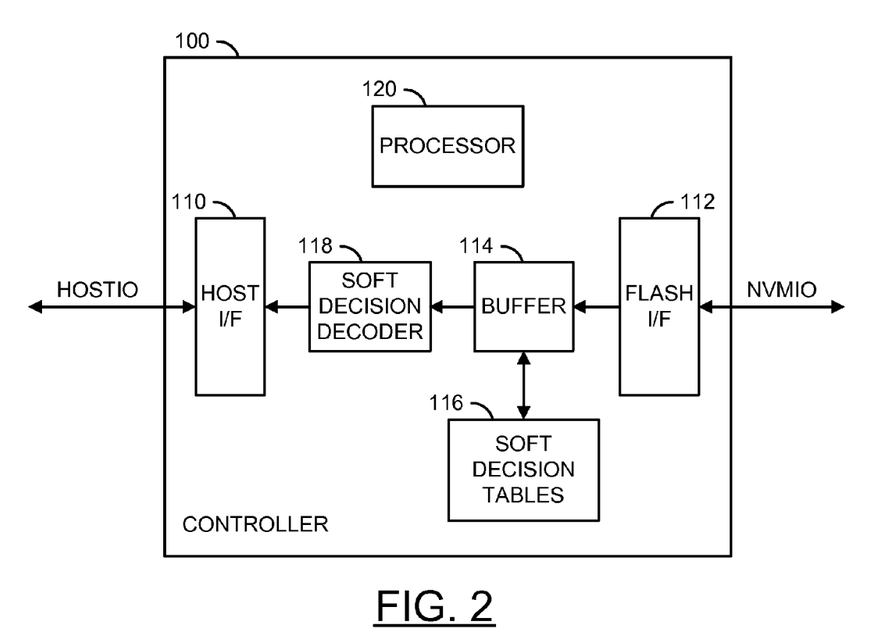
FIG. 2 is a block diagram of a controller circuit in accordance with an embodiment of the invention.

Referring to FIG. 2, a block diagram of an example implementation of the circuit 100 is shown in accordance with an embodiment of the invention. The circuit 100 generally comprises a block (or circuit) 110, a block (or circuit) 112, a block (or circuit) 114, a block (or circuit) 116, a block (or circuit) 118 and a block (or circuit) 120. The circuits 110 to 120 may represent modules and/or blocks that may be implemented as hardware, software, a combination of hardware and software, or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 110 to meet the criteria of a particular application.

The circuit 114 is shown implemented as a buffer circuit. The circuit 114 is operational to buffer codewords received from the circuit 94 via the circuit 112. The circuit 114 is also operational to buffer decoding parameters generated by the circuit 116. The read codewords and the decoding parameters are presented from the circuit 114 to the circuit 118.

The circuit 116 is shown implemented as a soft-decision table circuit. The circuit 116 is operational to store and present decoding parameters used in a soft-decision decoding performed by the circuit 118. The decoding parameters are presented by the circuit 116 to the circuit 114 for buffering and/or, in other embodiments, directly to circuit 118. A hardware or firmware unit within the circuit 116 processes the sequences of bits received from the circuit 94 into hard decision patterns. The values are generally stored within the circuit 116 as one or more lookup tables. The lookup tables are indexed into groups based on the number of reads of a current codeword. Each group has several sets of values indexed by a sequence of decoding attempts. Each set is indexed by the binary hard decision patterns for each read of each bit in the current codeword.

The circuit 118 is shown implemented as a soft-decision decoder circuit. In some embodiments, the circuit 118 is implemented as one or more low density parity check decoder circuits. The circuit 118 is operational to perform both hard-decision (e.g., HD) decoding and soft-decision (e.g., SD) decoding of the codewords received from the circuit 114. The soft-decision decoding generally utilizes the decoding parameters presented by the circuit 116.

The circuit 120 is shown implemented as a processor circuit. The circuit 120 is operational to command and/or assist with the multiple read/write requests and to control one or more reference voltages used in the circuit 94 to read the codewords.

Figure 3:
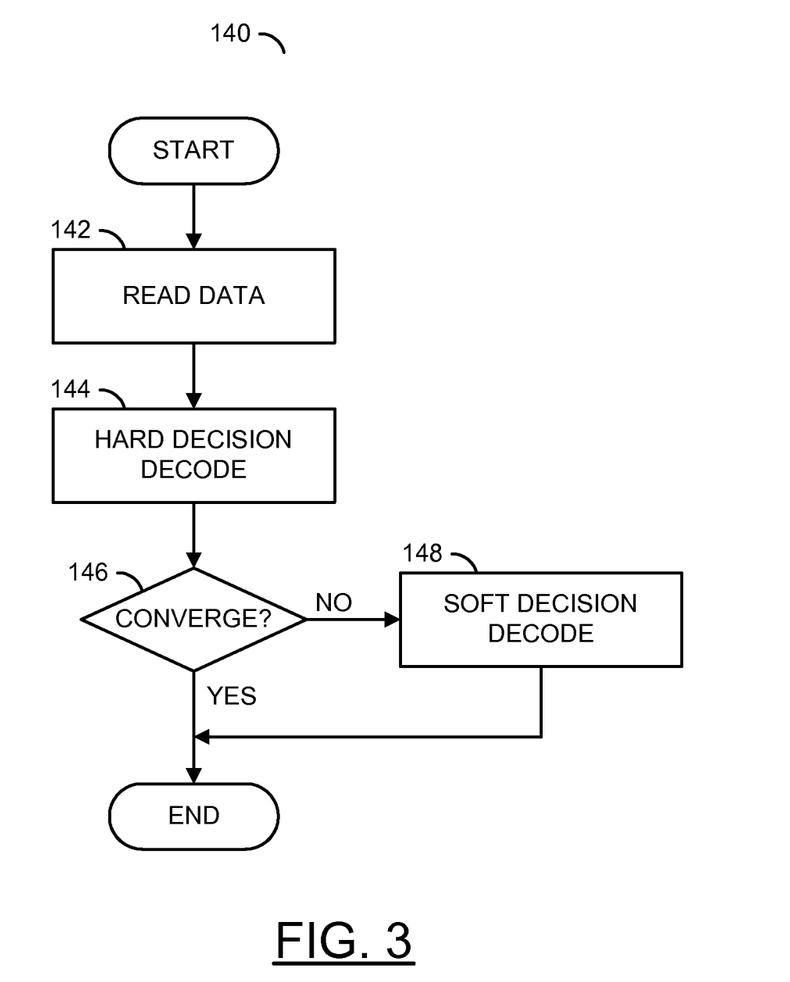
FIG. 3 is a flow diagram of a read error recovery of a codeword.

Referring to FIG. 3, a flow diagram of an example method 140 for a read error recovery of a codeword is shown. The method (or process) 140 is implemented by the circuit 100. The method 140 generally comprises a step (or state) 142, a step (or state) 144, a step (or state) 146 and a step (or state) 148. The steps 142 to 148 may represent modules and/or blocks that may be implemented as hardware, software, a combination of hardware and software, or other implementations. The sequence of the steps is shown as a representative example. Other step orders may be implemented to meet the criteria of a particular application.

In the step 142, a codeword is read from the circuit 94 by the circuit 100 and buffered in the circuit 114. A hard-decision decoding is performed by the circuit 118 in the step 144. If the hard-decision decoding converges per the step 146, the decoded data is presented in the signal HOSTIO from the circuit 110 to the circuit 92. If the hard-decision decoding does not converge per the step 146, a soft-decision decoding process is performed by at least one or more of the circuits 114, 116, 118 and 120 in the step 148. The soft-decision decoding generally utilized the log likelihood values stored in the tables in the circuit 116.

Figure 4:
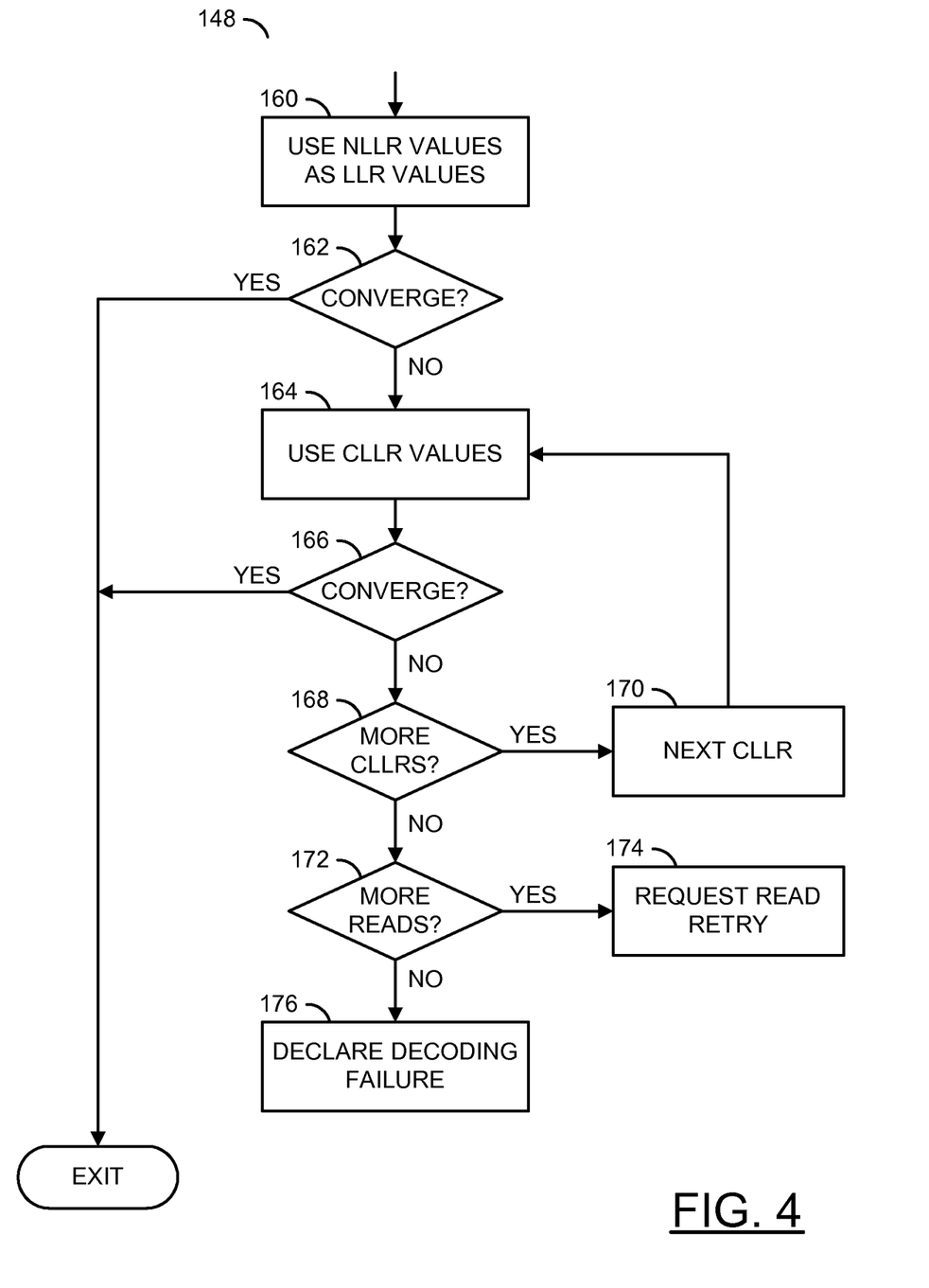
FIG. 4 is a flow diagram of a soft decision decode.

Referring to FIG. 4, a flow diagram of an example implementation of the soft decision decode step 148 is shown. The step 148 is implemented by the circuit 100. The step 148 generally comprises a step (or state) 160, a step (or state) 162, a step (or state) 164, a step (or state) 166, a step (or state) 168, a step (or state) 170, a step (or state) 172, a step (or state) 174 and a step (or state) 176. The steps 160 to 176 may represent modules and/or blocks that may be implemented as hardware, software, a combination of hardware and software, or other implementations. The sequence of the steps is shown as a representative example. Other step orders may be implemented to meet the criteria of a particular application.

In the step 160, the circuit 116 presents a set of normal log likelihood ratio (e.g., NLLR) values as the log likelihood ratio values for a current read of a current codeword. The set is one of many sets in an initial set group stored in the tables of the circuit 116. The circuit 118 uses the log likelihood ratio values in a soft decision decoding of the current codeword. If the decoding converges, the step 148 is ended and the decoded data is presented to the circuit 92 in the signal HOSTIO.

In situations where the decoding does not converge, the circuits 116 and 118 will use a set of compensated log likelihood ratio (e.g., CLLR) values in an attempt to decode the current codeword. If the decoding converges with the compensated log likelihood ratio values, the decoded data is presented to the circuit 92 in the signal HOSTIO.

If the decoding does not converge, a check is performed by the circuit 100 to decide if additional sets of the compensated log likelihood ratio values are available in the tables within the circuit 116 for the current read. If one or more additional compensated sets are available, the circuit 116 presents a next compensated set to the circuit 118 in the step 170. The step 148 subsequently returns to the step 164 to decode the current codeword again using the next compensated set of log likelihood ratio values. A loop around the step 164 to the step 170 and back again generally continues until either a convergence is reached in the step 166 or all of the compensated sets in the group have been tried per the step 168.

If decoding has not been successful after utilizing all of the log likelihood ratio values in all of the sets in the initial group, the circuit 100 checks to see of a read retry is an available option. If more retry reads are available in the attempt to decode the current codeword, the circuit 100 requests a read retry in the step 174. The circuit 120 may adjust the read voltage used in the circuit 94 and start the decoding step 148 again.

Each retry read results in the circuit 116 using a different group of log likelihood ratio values in the lookup tables. A loop around the steps 160 to 174 and back to the step 160 continues until either the decoding converges (e.g., in the steps 162 or 166) or all available retry reads have been exhausted per the step 172. If decoding has not been successful after a last retry read has been made and a last compensated set has been used in the decoding, the circuit 100 declares a decoding failure in the step 176 and the step 148 ends.

Figure 5:
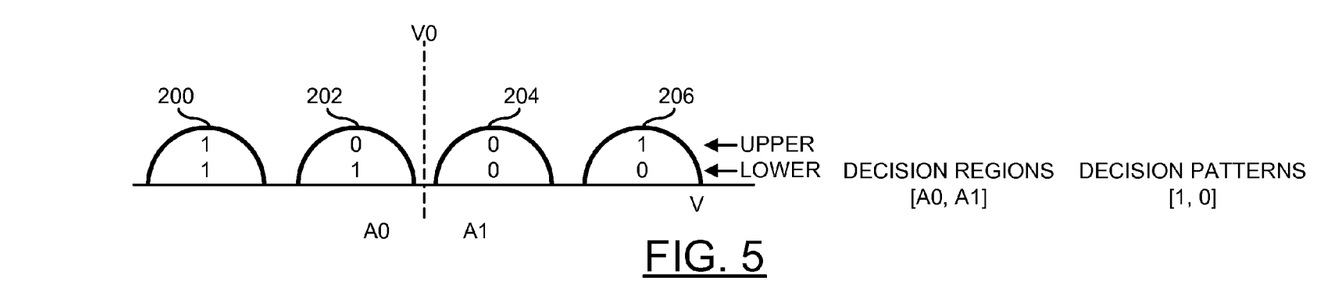
FIG. 5 is a diagram of charge-state distributions with a single read voltage.

Referring to FIG. 5, a diagram of example charge-state distributions in two bits per cell type nonvolatile memory cells with a single read voltage is shown. Each cell can be programmed into one of multiple (e.g., four) states 200-206. Each of the multiple states is interpreted as multiple (e.g., 2) bits. Half the bits are considered part of an upper page. The other half of the bits are considered part of a lower page.

The four charge-state distributions 200-206 from left to right are mapped to states "11", "01", "00" and "10", respectively. By reading the cell with a single read voltage (e.g., V0), the voltage axis (e.g., x-axis V) is divided into two regions (or areas) A0 and A1. A read using the voltage V0 that senses a cell to be programmed in the region A0 (e.g., state 200 or 202) results in a decision that the lower page of the cell stores a binary one value. A read using the voltage V0 that senses the cell to be in the region A1 (e.g., state 204 or 206) results in a decision that the lower page of the cell stores a binary zero value. Therefore, possible decision patterns [1, 0] exist on the lower page for decision regions [A0, A1]. An additional read and decision are used to decide what value is stored in the upper page.

Figure 6:
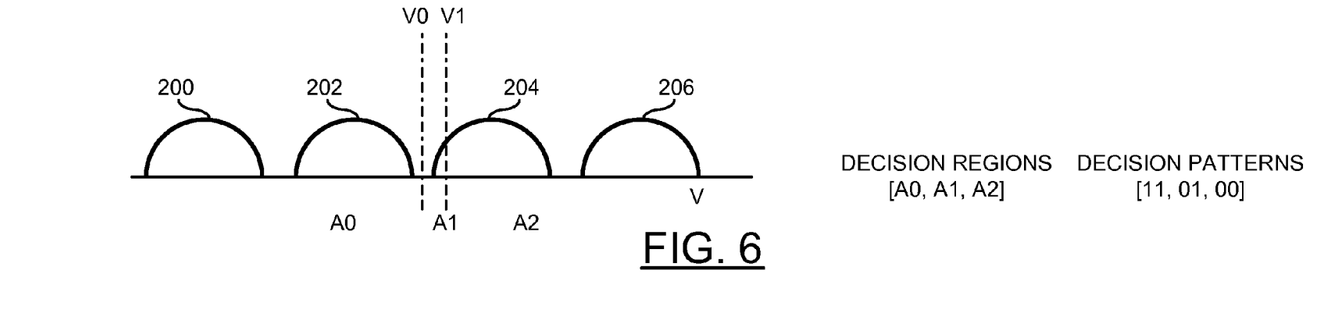
FIG. 6 is a diagram of the charge-state distributions with two read voltages.

Referring to FIG. 6, a diagram of the example charge-state distributions with two read voltages is shown. By reading the cell with two read voltages (e.g., V0 and V1), the voltage axis is divided into three regions (or areas) A0, A1 and A2. A read at both voltages V0 and V1 that sense the cell to be in the region A0 results in a decision that the lower page of the cell stores a binary one value. A read at both voltages V0 and V1 that sense the cell to be in the region A1 results in a decision that the lower page of the cell stores either a binary zero value (e.g., a program state sensed using V1) or a binary one value (e.g., an erased state sensed using V0). A read at both voltages V0 and V1 that sense the cell to be in the region A2 results in a decision that the lower page of the cell stores a binary zero value. Therefore, possible decision patterns [11, 01, 00] exist for decision regions [A0, A1, A2]. Additional reads and decisions are used to determine what value is stored in the upper page.

Figure 7:
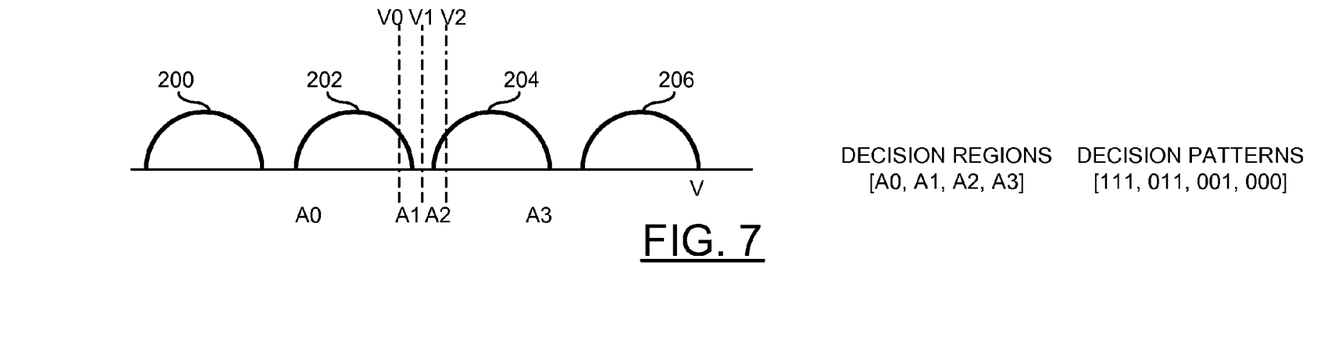
FIG. 7 is a diagram of the example charge-state distributions with three read voltages.

Referring to FIG. 7, a diagram of the example charge-state distributions with three read voltages is shown. By reading the cell with three read voltages (e.g., V0, V1 and V2), the voltage axis is divided into four regions (or areas) A0, A1, A2 and A3. The possible decision patterns [111, 011, 001, 000] exist for decision regions [A0, A1, A2, A3]. Generally, the number of decision patterns is N+1 for N reads of the lower page. For the upper page (with conventional Gray coding), a maximum of 2×N hard decision patterns exist, since a pair of read voltages is used for each read.

Figure 8:
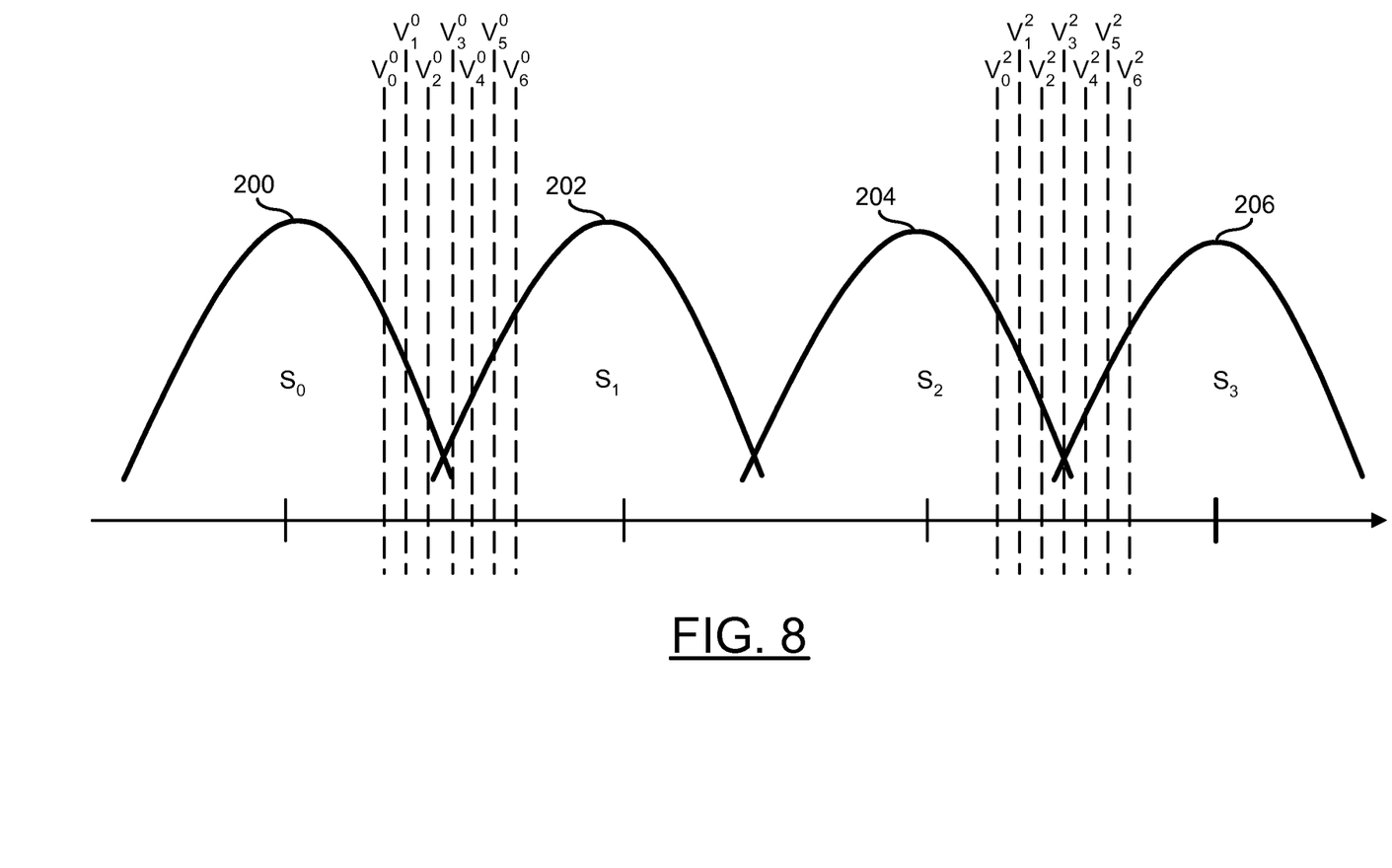
FIG. 8 is a diagram of the example charge-state distributions with seven read voltages.

Referring to FIG. 8, a diagram of the example charge-state distributions with seven read voltages is shown. FIG. 8 shows reads on an upper page of a multi-level cell. For multi-level cell channels, the log likelihood ratio values are a function of the four charge-state distributions (e.g., means and variances) and the read reference voltages for reading.

Figure 9:
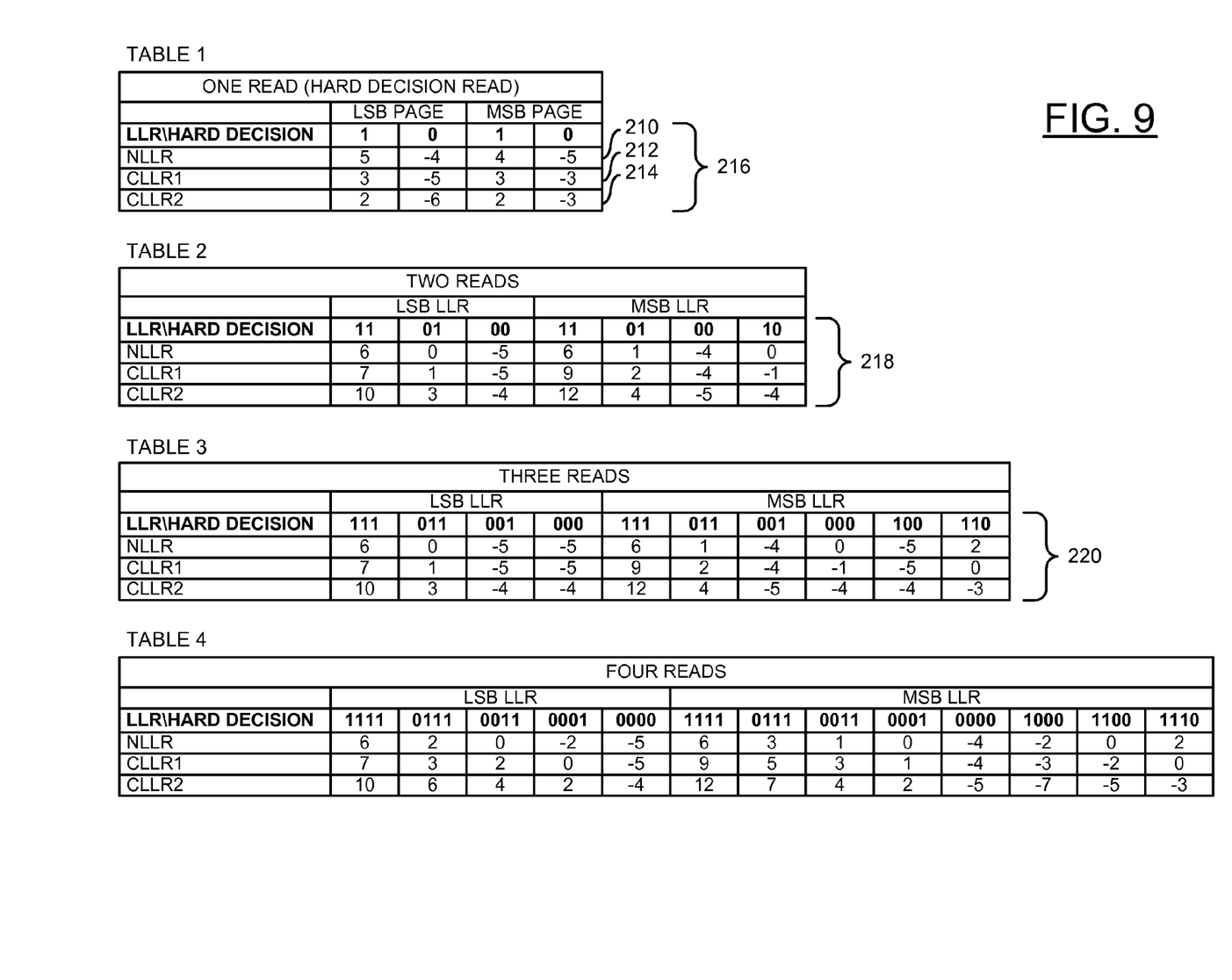
FIG. 9 is a set of tables of the log likelihood ratio values for one or four reads.

Referring to FIG. 9, example tables of the log likelihood ratio values for one to four reads are shown. Table 1 illustrates a set 210 of normal log likelihood ratio (e.g., NLLR) values and two sets 212-214 of compensated log likelihood ratio (e.g., CLLR1 and CLLR2) values for a single read. The three sets 210-214 form an initial group 216 of values stored in the circuit 116. Based on (i) the decision pattern [1, 0] and page (e.g., least significant bit page or most significant bit page) of a hard read and (ii) the current set being used to decode (e.g., NLLR, CLLR1 or CLLR2), the circuit 116 indexes a particular log likelihood ratio value from Table I and presents the value. The log likelihood ratio values corresponding to decision pattern 1 have positive values. The log likelihood ratio vales corresponding to decision pattern 0 have negative values.

Table 2 illustrates another set of normal log likelihood ratio values and two additional sets of compensated log likelihood ratio values for two reads (e.g., a read and a retry read). The three sets for another group 218 of values used stored in the circuit 116. Based on (i) the decision pattern [11, 01, 00] and page (e.g., column) of hard reads and (ii) the current set being used to decode (e.g., row), the circuit 116 indexes a particular log likelihood ratio value from Table 2 and presents the value. The log likelihood ratio values corresponding to decision patterns having mostly 1 have positive values. The log likelihood ratio vales corresponding to decision patters having mostly 0 have negative values.

Table 3 illustrates a set of normal log likelihood ratio values and two more sets of compensated log likelihood ratio values for three reads (e.g., a read and two retry reads). The three sets form another group 220 of values used stored in the circuit 116.

Table 4 illustrates a set of normal log likelihood ratio values and two more sets of compensated log likelihood ratio values for four reads (e.g., a read and three retry reads). The three sets for another group of values are stored in the circuit 116.

Figure 10:
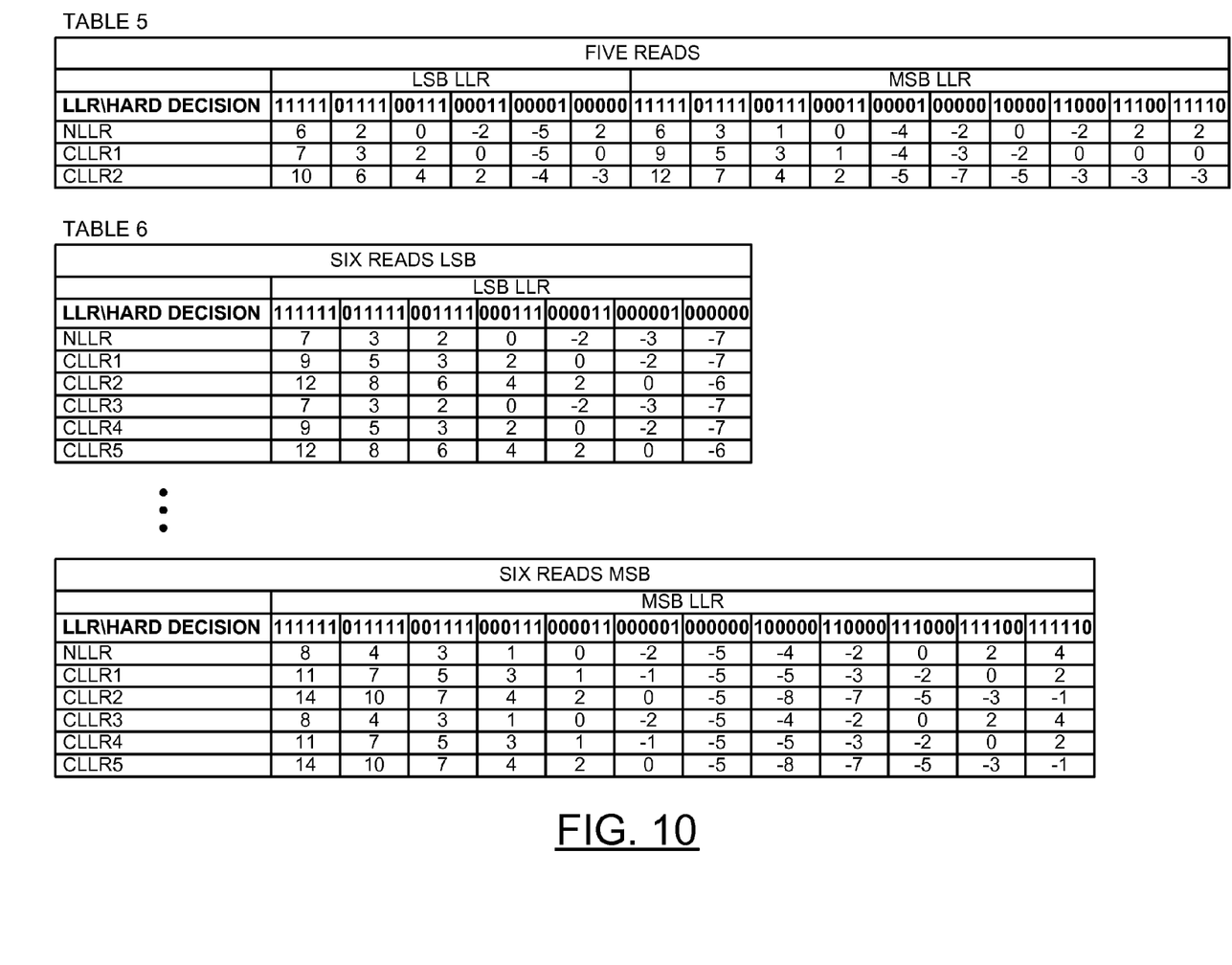
FIG. 10 is a set of tables of the log likelihood ratio values for five and six reads.

Referring to FIG. 10, example tables of the log likelihood ratio values for five and six reads are shown. Table 5 and Table 6 are arranged in a manner similar to Tables 1-4. Table 5 is illustrated with a normal set NLLR and two compensated sets CLLR1-CLLR2. Table 6 shows the normal set NLLR and five compensated sets CLLR1-CLLR5.

Figure 11:
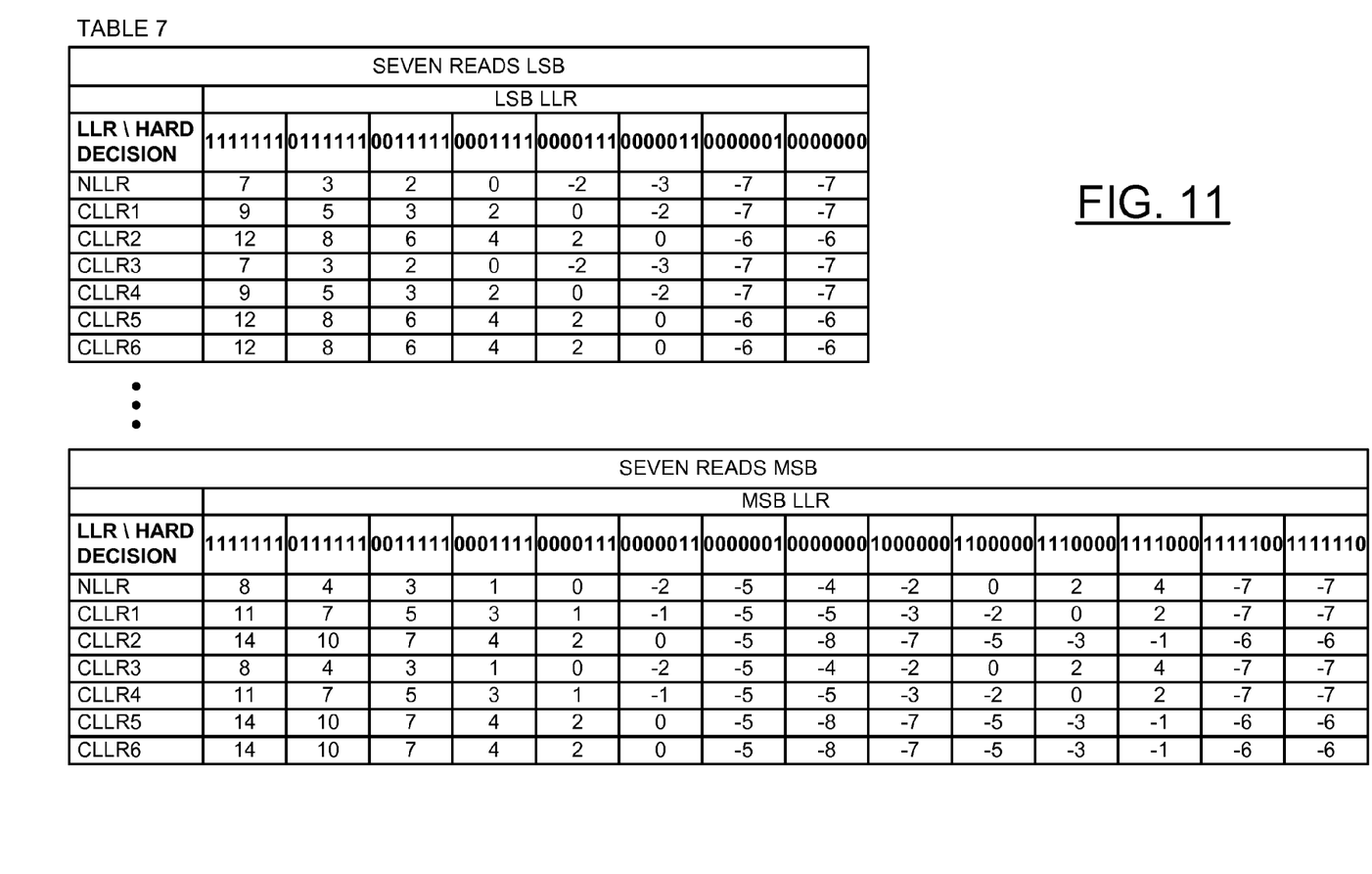
FIG. 11 is a table of the log likelihood ratio values for seven reads.

Referring to FIG. 11, an example table of the log likelihood ratio values for seven reads is shown. Table 7 is arranged in a manner similar to Tables 1-6. Table 7 is illustrated with the normal set NLLR and six compensated sets CLLR1-CLLR6.

After each read operation of NAND flash, the read back data is a binary sequence. The binary sequence, together with the sequences of previous reads, forms a sequence of the hard decision patterns. The values in the lookup tables in the circuit 116 are calculated for all possible hard decision patterns (including invalid patterns). The log likelihood ratio values shown in Tables 1-7 are examples that are determined by analysis or experiments. An initial row (or set) of each table contains the normal log likelihood ratio values. The remaining rows (or sets) of each table contains the compensated log likelihood ratio values, which generally have different values from the normal set. The different values for the compensated sets are determined with the consideration of adjusting the normal sets for mis-estimating of read voltages and/or for accommodating variations of means/variances of cell voltage distributions.

Depending on the amount of available memory and the cases specified to be covered, the number of compensated sets can be different after each retry read. For the examples shown in Tables 1-7, two compensated sets are created for one to five reads, five CLLR sets for six reads, and six compensated sets for seven reads.

Estimating cell voltage (or charge-state) distributions (e.g., means/variances) is a difficult job for solid-state drive controllers, especially for estimating an erase state. Therefore, the circuit 100 operates independently of the estimations of the means/variances, making the circuit 100 simpler and more robust.

For a different number of retry reads, a different number of log likelihood ratio values correspond to the hard decision patterns. So for different numbers of retry reads, different groups (e.g., different tables) are accessed. Instead of calculating the log likelihood ratio values online (based on the estimates of the means/variances), the circuit 100 uses a group of log likelihood ratio value sets for each number of retry reads. The log likelihood ratio values stored in the lookup tables are pre-defined by either analysis or experiments. A resulting advantage is a lack of online calculations, and so the circuit 100 is suitable for high speed soft retires. Each group of values (for a particular number of retry reads) includes a set of nominal values and several sets of compensated values. The nominal lookup table values are used for the initial soft decoding attempt. If decoding fails, the rest of the compensated lookup table values will be tried, one by one, for decoding.

The circuit 100 operates independently of knowledge of a channel distribution. The channel distributions are not assumed to be Gaussian, which is a realistic situation for high program/erase cycles. In various embodiments, the lookup tables can be measured from flash data processing. In other embodiments, the lookup tables can be estimated from simulations. Use of the tables generally involves low complexity and is suitable for firmware implementations.

The functions performed by the diagrams of FIGS. 1-4 and 9-11 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an interface configured to process a plurality of read/write operations to/from a memory; and
a control circuit configured to (i) store a plurality of groups in one or more lookup tables, wherein each of the plurality of groups comprises a plurality of sets and each of the plurality of sets comprises a plurality of log likelihood ratio values, (ii) read a codeword from the memory, (iii) read a first set of the plurality of sets in an initial group of the plurality of groups from the one or more lookup tables, (iv) attempt to decode the codeword based on the plurality of log likelihood ratio values in the first set in the initial group, and (v) in response to non-convergence with the plurality of log likelihood ratio values in the first set in the initial group, (a) read a second set of the plurality of sets in the initial group from the one or more lookup tables and (b) attempt to decode the codeword based on the plurality of log likelihood ratio values in the second set in the initial group.

2. The apparatus according to claim 1, wherein the control circuit is further configured to read a third set of the plurality of sets in the initial group from the one or more lookup tables in response to non-convergence with the plurality of log likelihood ratio values in the second set in the initial group.

3. The apparatus according to claim 1, wherein the control circuit is further configured to reread the codeword from the memory in response to non-convergence with the plurality of boa likelihood ratio values in the initial group.

4. The apparatus according to claim 3, wherein the control circuit is further configured to read an additional set of the plurality of sets in an additional group of the plurality of groups from the one or more lookup tables in response to the reread of the codeword from the memory.

5. The apparatus according to claim 3, wherein the control circuit is further configured to generate a plurality of patterns corresponding to a plurality of bits in the codeword based on both the read and the reread of the codeword from the memory.

6. The apparatus according to claim 5, wherein the control circuit is further configured to select the plurality of log likelihood ratio values used to attempt to decode the codeword based on the plurality of patterns.

7. The apparatus according to claim 1, wherein each of the plurality of groups comprises (i) a normal set of the plurality of log likelihood ratio values and (ii) a plurality of compensated sets of the plurality of log likelihood ratio values that are compensated relative to the normal set.

8. The apparatus according to claim 1, wherein (i) each of the plurality of sets is divided into a plurality of pages, (ii) each of the plurality of pages is divided into a corresponding subset of the plurality of log likelihood ratio values, and (iii) a respective one of the plurality of log likelihood ratio values corresponds to each of a plurality of possible patterns created by a plurality of reads of the codeword from the memory.

9. The apparatus according to claim 1, wherein the interface and the control circuit are part of a solid-state drive controller.

10. A method for decoding with a plurality of log likelihood ratio values stored in a control circuit, comprising the steps of:
storing a plurality of groups in one or more lookup tables in the control circuit, wherein each of the plurality of groups comprises a plurality of sets and each of the plurality of sets comprises the plurality of log likelihood ratio values;
reading a codeword from a memory;
reading a first set of the plurality of sets in an initial group of the plurality of groups from the one or more lookup tables;
attempting to decode the codeword based on the plurality of log likelihood ratio values in the first set in the initial group; and
in response to non-convergence with the plurality of log likelihood ratio values in the first set in the initial group, (a) reading a second set of the plurality of sets in the initial group from the one or more lookup tables and (b) attempting to decode the codeword based on the plurality of log likelihood ratio values in the second set in the initial group.

11. The method according to claim 10, further comprising the step of:
reading a third set of the plurality of sets in the initial group from the one or more lookup tables in response to non-convergence with the plurality of log likelihood ratio values in the second set in the initial group.

12. The method according to claim 10, further comprising the step of:
rereading the codeword from the memory in response to non-convergence with the plurality of log likelihood ratio values in the initial group.

13. The method according to claim 12, further comprising the step of:
reading an additional set of the plurality of sets in an additional group of the plurality of groups from the one or more lookup tables in response to the reread of the codeword from the memory.

14. The method according to claim 12, further comprising the step of:
generating a plurality of patterns corresponding to a plurality of bits in the codeword based on both the read and the reread of the codeword from the memory.

15. The method according to claim 14, further comprising the step of:
selecting the plurality of log likelihood ratio values used to decode the codeword based on the plurality of patterns.

16. The method according to claim 10, wherein each of the plurality of groups comprises (i) a normal set of the plurality of log likelihood ratio values and (ii) a plurality of compensated sets of the plurality of log likelihood ratio values that are compensated relative to the normal set.

17. The method according to claim 10, wherein (i) each of the plurality of sets is divided into a plurality of pages, (ii) each of the plurality of pages is divided into a corresponding subset of the plurality of log likelihood ratio values, and (iii) a respective one of the plurality of log likelihood ratio values corresponds to each of a plurality of possible patterns created by a plurality of reads of the codeword from the memory.

18. The method according to claim 10, wherein the steps are performed in a solid-state drive controller.

19. An apparatus comprising:
a memory configured to store data; and
a controller configured to (i) process a plurality of input/output requests to read/write to/from the memory, (ii) store a plurality of groups in one or more lookup tables, wherein each of the plurality of groups comprises a plurality of sets and each of the plurality of sets comprises a plurality of log likelihood ratio values, (iii) read a codeword from the memory, (iv) read a first set of the plurality of sets in an initial group of the plurality of groups from the one or more lookup tables, (v) attempt to decode the codeword based on the plurality of log likelihood ratio values in the first set in the initial group, and (vi) in response to non-convergence with the plurality of log likelihood ratio values in the first set in the initial group, (a) read a second set of the plurality of sets in the initial group from the one or more lookup tables and (b) attempt to decode the codeword based on the plurality of log likelihood ratio values in the second set in the initial group.

20. The apparatus according to claim 19, wherein the memory and the controller are part of a solid-state drive.

* * * * *